(12) United States Patent
Damodaran et al.

(10) Patent No.: US 8,656,105 B2
(45) Date of Patent: Feb. 18, 2014

(54) OPTIMIZING TAG FORWARDING IN A TWO LEVEL CACHE SYSTEM FROM LEVEL ONE TO LEVER TWO CONTROLLERS FOR CACHE COHERENCE PROTOCOL FOR DIRECT MEMORY ACCESS TRANSFERS

(75) Inventors: Raguram Damodaran, Plano, TX (US); Abhijeet Ashok Chachad, Plano, TX (US); Joseph Raymond Michael Zbiciak, Arlington, TX (US); Jonathan (Son) Hung Tran, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 76 days.

(21) Appl. No.: 13/245,206

(22) Filed: Sep. 26, 2011

(65) Prior Publication Data

US 2012/0191916 A1    Jul. 26, 2012

Related U.S. Application Data

(60) Provisional application No. 61/387,283, filed on Sep. 28, 2010.

(51) Int. Cl.
*G06F 12/08* (2006.01)
(52) U.S. Cl.
USPC ........................................................ 711/122
(58) Field of Classification Search
None
See application file for complete search history.

(56) References Cited

U.S. PATENT DOCUMENTS

| 6,018,763 | A  | * | 1/2000  | Hughes et al. ............... 709/213 |
| 6,134,633 | A  | * | 10/2000 | Jacobs ......................... 711/137 |
| 6,681,299 | B1 | * | 1/2004  | Shimamura et al. .......... 711/145 |
| 7,213,106 | B1 | * | 5/2007  | Koster et al. ................. 711/119 |
| 2008/0235457 | A1 | * | 9/2008 | Hasenplaugh et al. ....... 711/130 |
| 2009/0157968 | A1 | * | 6/2009 | Bell et al. ..................... 711/128 |
| 2012/0191916 | A1 | * | 7/2012 | Chachad et al. .............. 711/122 |

* cited by examiner

*Primary Examiner* — Alford W. Kindred
*Assistant Examiner* — Ramon A Mercado
(74) *Attorney, Agent, or Firm* — Robert D. Marshall, Jr.; W. James Brady; Frederick J. Telecky, Jr.

(57) ABSTRACT

A second level memory controller uses shadow tags 711 to implement snoop read and write coherence. These shadow tags are generally used only for snoops intending to keep L2 SRAM coherent with the level one data cache. Thus updates for all external cache lines are ignored. The shadow tags are updated on all level one cache allocates and all dirty and invalidate modifications to data stored in L2 SRAM. These interactions happen on different interfaces, but the traffic on that interface includes level one data cache accesses to both external and level two directly addressable lines. These interactions create extra traffic on these interfaces and creating extra stalls to the CPU. Thus in this invention shadow tags are updated only on a subset of less than all updates of the level one tags.

12 Claims, 7 Drawing Sheets (1) L1I CACHE MISS FILL FROM L2
(2) L1D CACHE MISS FILL FROM L2
(3) L1D WRITE MISS TO L2, OR L1D VICTIM TO L2, OR L1D SNOOP RESPONSE TO L2
(4) L2 CACHE MISS FILL, OR DMA INTO L2
(5) L2 VICTIM WRITE BACK, OR DMA OUT OF L2
(6) DMA INTO L2
(7) DMA OUT OF L2

| 31 ○○○ 29 | 28 | 27 ○○○ 23 | 22 ○○○ 18 | 17 ○○○ 13 | 12 ○○○ 2 | 1 | 0 |
|---|---|---|---|---|---|---|---|
| creg | z | dst | src2 | scr1/cst | opcode | s | p |

US 8,656,105 B2

OPTIMIZING TAG FORWARDING IN A TWO LEVEL CACHE SYSTEM FROM LEVEL ONE TO LEVER TWO CONTROLLERS FOR CACHE COHERENCE PROTOCOL FOR DIRECT MEMORY ACCESS TRANSFERS

CLAIM OF PRIORITY

This application claims priority under 35 U.S.C. 119(e)(1) to U.S. Provisional Application No. 61/387,283 filed Sep. 28, 2010.

TECHNICAL FIELD OF THE INVENTION

The technical field of this invention is cache in digital data processors.

BACKGROUND OF THE INVENTION

A data processor to which the present invention is applicable employs a two-level memory subsystem. The level one memory includes instruction cache (L1I) and data cache (L1D) and the level two memory contains directly addressable memory (SRAM), level two cache or both. The SRAM at level two can be cached within level one. Direct memory access (DMA) units can directly access the SRAM at level two. Keeping central processing unit (CPU) and direct memory access (DMA) data transfers to the level two memory coherent is important to the programmability of the device. Making this efficient is important to the performance of the device.

SUMMARY OF THE INVENTION

The data processor to which the present invention is applicable includes a copy of the level one data cache tag memory in the level two controller. The level two controller uses this shadow copy of the tags to implement its snoop read and write coherence. The level two controller tracks the status of level one data cache lines. Since this shadow copy of the tags is used only for snoops intending to keep level two directly addressable memory coherent with the level one data cache, the information for all external cache lines are ignored. The shadow copy of the level one data cache tag RAM in the level two controller is updated on all level one data cache allocates and all dirty and invalidate modifications. These interactions happen on different interfaces, but the traffic on that interface includes level one data cache accesses to both external and level two directly addressable lines. That creates extra traffic on these interfaces and also creating extra stalls to the CPU. Thus the shadow tags are updated only on a subset of less than all updates of the level one tags.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
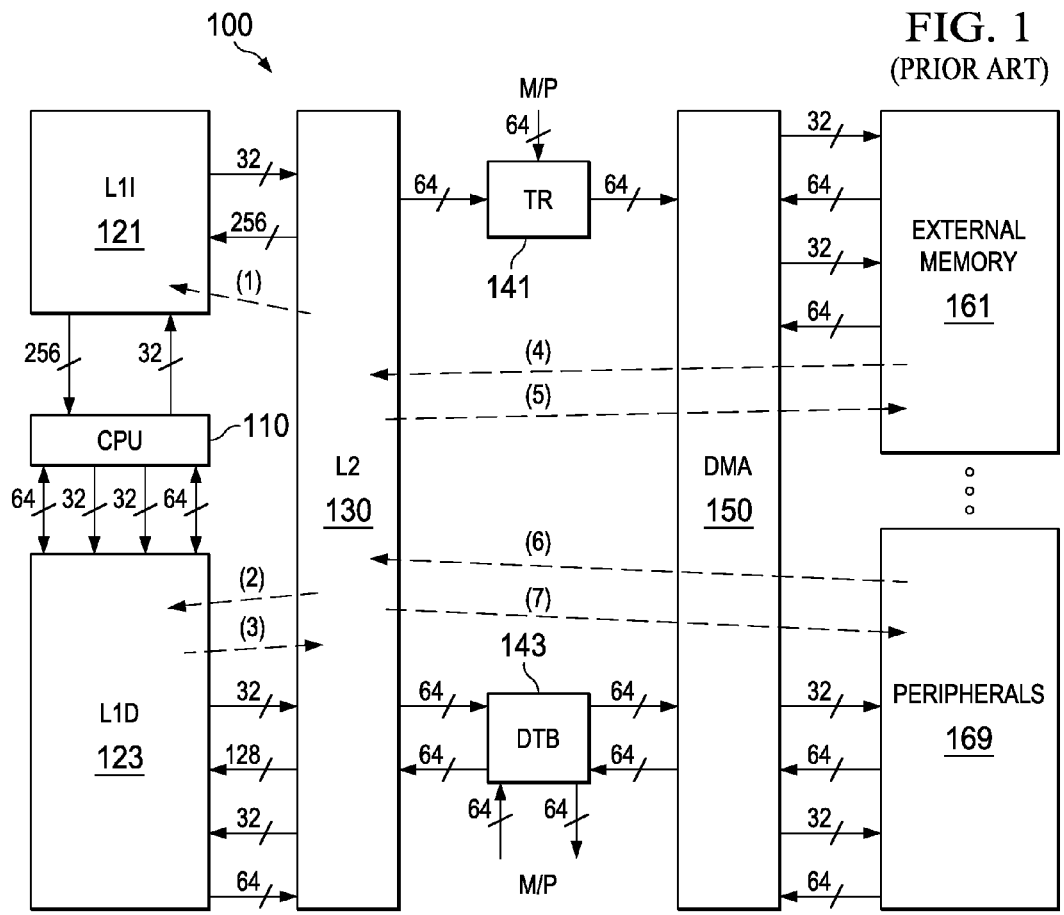
FIG. 1 illustrates the organization of a typical digital signal processor to which this invention is applicable (prior art)

FIG. 1 illustrates the organization of a typical digital signal processor system 100 to which this invention is applicable (prior art). Digital signal processor system 100 includes central processing unit core 110. Central processing unit core 110 includes the data processing portion of digital signal processor system 100. Central processing unit core 110 could be constructed as known in the art and would typically include a register file, an integer arithmetic logic unit, an integer multiplier and program flow control units. An example of an appropriate central processing unit core is described below in conjunction with FIGS. 2 to 4.

Digital signal processor system 100 includes a number of cache memories. FIG. 1 illustrates a pair of first level caches. Level one instruction cache (L1I) 121 stores instructions used by central processing unit core 110. Central processing unit core 110 first attempts to access any instruction from level one instruction cache 121. Level one data cache (L1D) 123 stores data used by central processing unit core 110. Central processing unit core 110 first attempts to access any required data from level one data cache 123. The two level one caches are backed by a level two unified cache (L2) 130. In the event of a cache miss to level one instruction cache 121 or to level one data cache 123, the requested instruction or data is sought from level two unified cache 130. If the requested instruction or data is stored in level two unified cache 130, then it is supplied to the requesting level one cache for supply to central processing unit core 110. As is known in the art, the requested instruction or data may be simultaneously supplied to both the requesting cache and central processing unit core 110 to speed use.

Level two unified cache 130 is further coupled to higher level memory systems. Digital signal processor system 100 may be a part of a multiprocessor system. The other processors of the multiprocessor system are coupled to level two unified cache 130 via a transfer request bus 141 and a data transfer bus 143. A direct memory access unit 150 provides the connection of digital signal processor system 100 to external memory 161 and external peripherals 169.

FIG. 1 illustrates several data/instruction movements within the digital signal processor system 100. These include: (1) instructions move from L2 cache 130 to L1I cache 121 to fill in response to a L1I cache miss; (2) data moves from L2 cache 130 to L1D cache 123 to fill in response to a L1D cache miss; (3) data moves from L1D cache 123 to L2 cache 130 in response to a write miss in L1D cache 123, in response to a L1D cache 123 victim eviction and in response to a snoop from L2 cache 130; (4) data moves from external memory 161 to L2 cache 130 to fill in response to L2 cache miss or a direct memory access (DMA) data transfer into L2 cache 130; (5) data moves from L2 cache 130 to external memory 161 in response to a L2 cache victim eviction or writeback and in response to a DMA transfer out of L2 cache 130; (6) data moves from peripherals 169 to L2 cache 130 in response to a DMA transfer into L2 cache 130; and (7) data moves from L2 cache 130 to peripherals 169 is response to a DMA transfer out of L2 cache 130.

Figure 2:
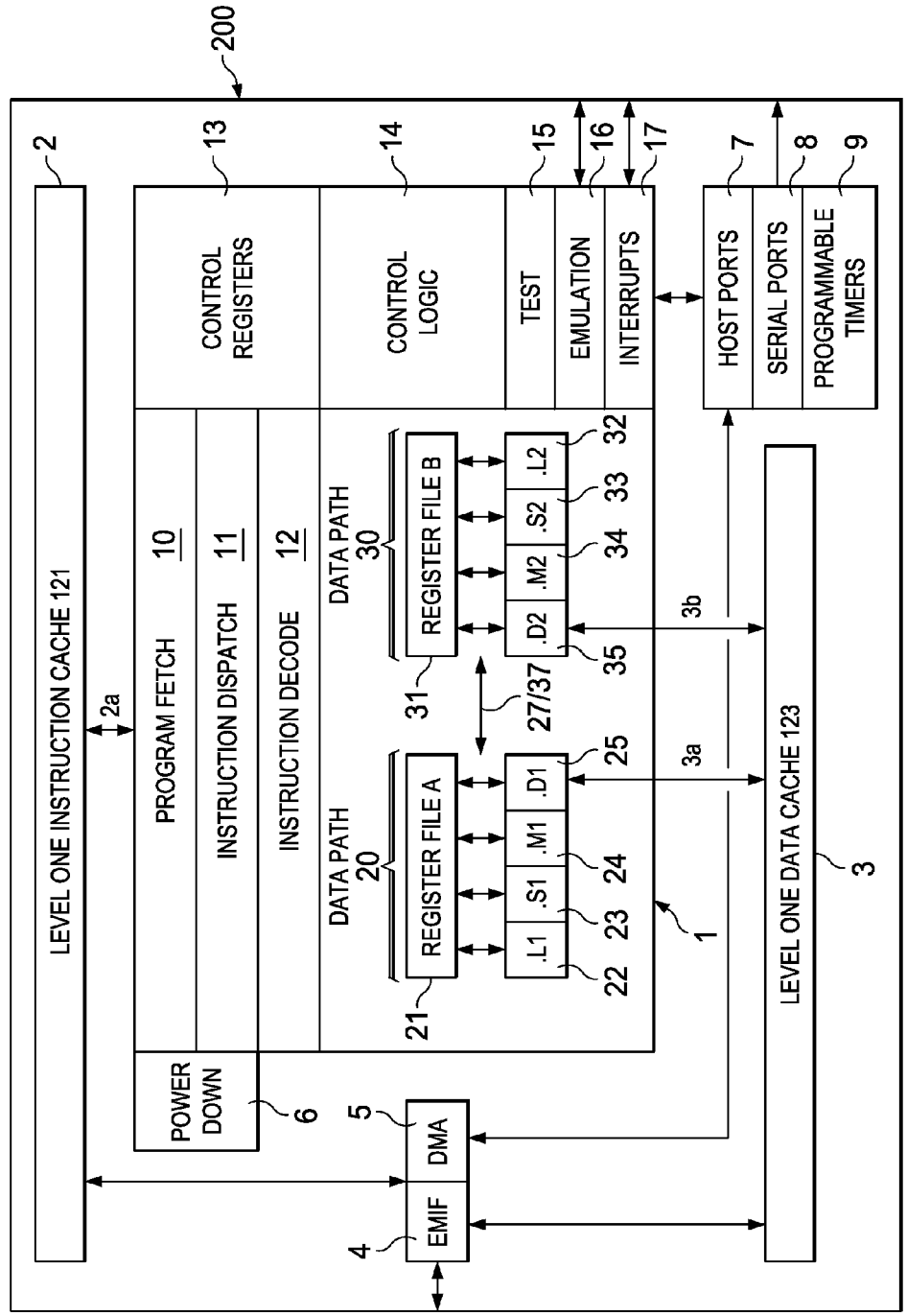
FIG. 2 illustrates details of a very long instruction word digital signal processor core suitable for use in Figure (prior art)

FIG. 2 is a block diagram illustrating details of a digital signal processor integrated circuit 200 suitable but not essential for use in this invention (prior art). The digital signal processor integrated circuit 200 includes central processing unit 1, which is a 32-bit eight-way VLIW pipelined processor. Central processing unit 1 is coupled to level one instruction cache 121 included in digital signal processor integrated circuit 200. Digital signal processor integrated circuit 200 also includes level one data cache 123. Digital signal processor integrated circuit 200 also includes peripherals 4 to 9. These peripherals preferably include an external memory interface (EMIF) 4 and a direct memory access (DMA) controller 5. External memory interface (EMIF) 4 preferably supports access to supports synchronous and asynchronous SRAM and synchronous DRAM. Direct memory access (DMA) controller 5 preferably provides 2-channel auto-boot loading direct memory access. These peripherals include power-down logic 6. Power-down logic 6 preferably can halt central processing unit activity, peripheral activity, and phase lock loop (PLL) clock synchronization activity to reduce power consumption. These peripherals also include host ports 7, serial ports 8 and programmable timers 9.

Central processing unit 1 has a 32-bit, byte addressable address space. Internal memory on the same integrated circuit is preferably organized in a data space including level one data cache 123 and a program space including level one instruction cache 121. When off-chip memory is used, preferably these two spaces are unified into a single memory space via the external memory interface (EMIF) 4.

Level one data cache 123 may be internally accessed by central processing unit 1 via two internal ports 3a and 3b. Each internal port 3a and 3b preferably has 32 bits of data and a 32-bit byte address reach. Level one instruction cache 121 may be internally accessed by central processing unit 1 via a single port 2a. Port 2a of level one instruction cache 121 preferably has an instruction-fetch width of 256 bits and a 30-bit word (four bytes) address, equivalent to a 32-bit byte address.

Central processing unit 1 includes program fetch unit 10, instruction dispatch unit 11, instruction decode unit 12 and two data paths 20 and 30. First data path 20 includes four functional units designated L1 unit 22, S1 unit 23, M1 unit 24 and D1 unit 25 and 16 32-bit A registers forming register file 21. Second data path 30 likewise includes four functional units designated L2 unit 32, S2 unit 33, M2 unit 34 and D2 unit 35 and 16 32-bit B registers forming register file 31. The functional units of each data path access the corresponding register file for their operands. There are two cross paths 27 and 37 permitting access to one register in the opposite register file each pipeline stage. Central processing unit 1 includes control registers 13, control logic 14, and test logic 15, emulation logic 16 and interrupt logic 17.

Program fetch unit 10, instruction dispatch unit 11 and instruction decode unit 12 recall instructions from level one instruction cache 121 and deliver up to eight 32-bit instructions to the functional units every instruction cycle. Processing occurs simultaneously in each of the two data paths 20 and 30. As previously described each data path has four corresponding functional units (L, S, M and D) and a corresponding register file containing 16 32-bit registers. Each functional unit is controlled by a 32-bit instruction. The data paths are further described below. A control register file 13 provides the means to configure and control various processor operations.

Figure 3:
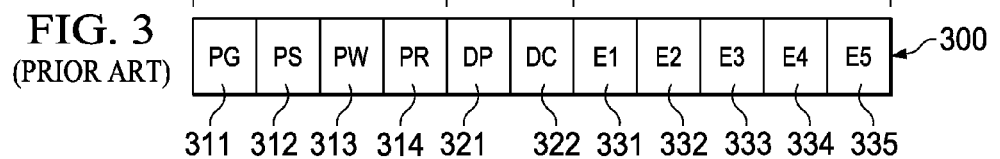
FIG. 3 illustrates the pipeline stages of the very long instruction word digital signal processor core illustrated in FIG. 2 (prior art)

FIG. 3 illustrates the pipeline stages 300 of digital signal processor core 110 (prior art). These pipeline stages are divided into three groups: fetch group 310; decode group 320; and execute group 330. All instructions in the instruction set flow through the fetch, decode, and execute stages of the pipeline. Fetch group 310 has four phases for all instructions, and decode group 320 has two phases for all instructions. Execute group 330 requires a varying number of phases depending on the type of instruction.

The fetch phases of the fetch group 310 are: Program address generate phase 311 (PG); Program address send phase 312 (PS); Program access ready wait stage 313 (PW); and Program fetch packet receive stage 314 (PR). Digital signal processor core 110 uses a fetch packet (FP) of eight instructions. All eight of the instructions proceed through fetch group 310 together. During PG phase 311, the program address is generated in program fetch unit 10. During PS phase 312, this program address is sent to memory. During PW phase 313, the memory read occurs. Finally during PR phase 314, the fetch packet is received at CPU 1.

The decode phases of decode group 320 are: Instruction dispatch (DP) 321; and Instruction decode (DC) 322. During the DP phase 321, the fetch packets are split into execute packets. Execute packets consist of one or more instructions which are coded to execute in parallel. During DP phase 322, the instructions in an execute packet are assigned to the appropriate functional units. Also during DC phase 322, the source registers, destination registers and associated paths are decoded for the execution of the instructions in the respective functional units.

The execute phases of the execute group 330 are: Execute 1 (E1) 331; Execute 2 (E2) 332; Execute 3 (E3) 333; Execute 4 (E4) 334; and Execute 5 (E5) 335. Different types of instructions require different numbers of these phases to complete. These phases of the pipeline play an important role in understanding the device state at CPU cycle boundaries.

During E1 phase 331, the conditions for the instructions are evaluated and operands are read for all instruction types. For load and store instructions, address generation is performed and address modifications are written to a register file. For branch instructions, branch fetch packet in PG phase 311 is affected. For all single-cycle instructions, the results are written to a register file. All single-cycle instructions complete during the E1 phase 331.

During the E2 phase 332, for load instructions, the address is sent to memory. For store instructions, the address and data are sent to memory. Single-cycle instructions that saturate results set the SAT bit in the control status register (CSR) if saturation occurs. For single cycle 16 by 16 multiply instructions, the results are written to a register file. For M unit non-multiply instructions, the results are written to a register file. All ordinary multiply unit instructions complete during E2 phase 322.

During E3 phase 333, data memory accesses are performed. Any multiply instruction that saturates results sets the SAT bit in the control status register (CSR) if saturation occurs. Store instructions complete during the E3 phase 333.

During E4 phase 334, for load instructions, data is brought to the CPU boundary. For multiply extension instructions, the results are written to a register file. Multiply extension instructions complete during the E4 phase 334.

During E5 phase 335, load instructions write data into a register. Load instructions complete during the E5 phase 335.

Figures 4, 5:
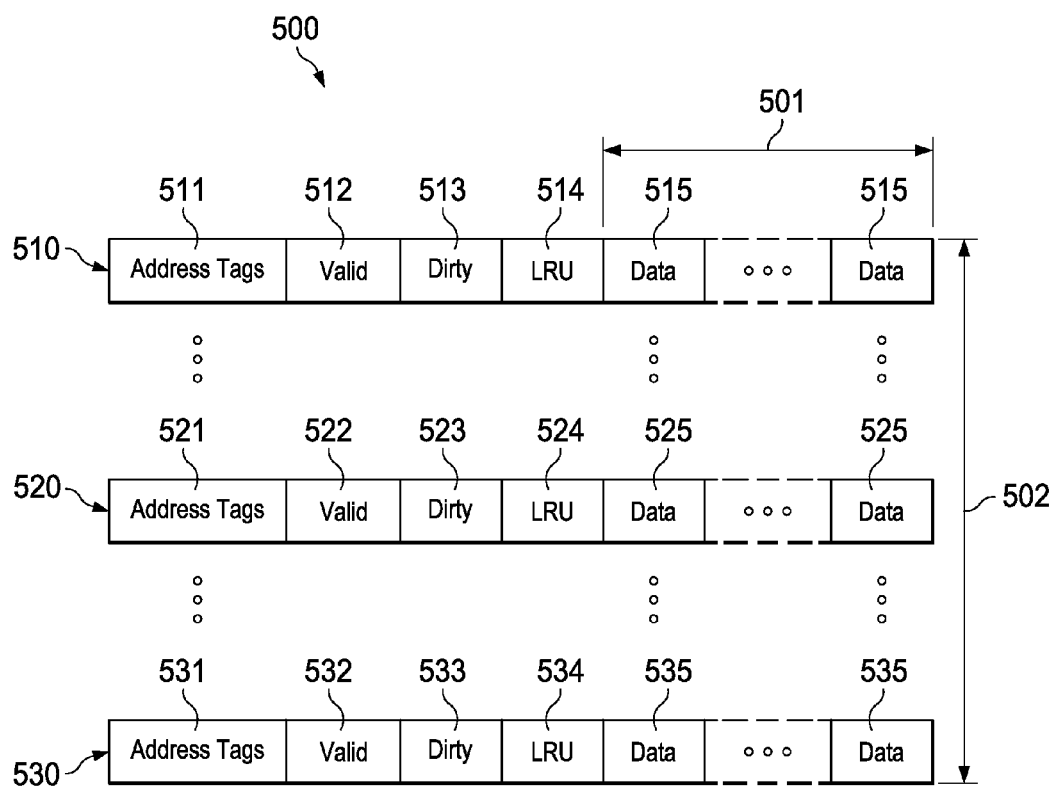
FIG. 4 illustrates the instruction syntax of the very long instruction word digital signal processor core illustrated in FIG. 2 (prior art)
FIG. 5 illustrates the details of a set of typical prior art cache lines (prior art)

FIG. 4 illustrates an example of the instruction coding of instructions used by digital signal processor core 110 (prior art). Each instruction consists of 32 bits and controls the operation of one of the eight functional units. The bit fields are defined as follows. The creg field (bits 29 to 31) is the conditional register field. These bits identify whether the instruction is conditional and identify the predicate register. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field is encoded in the instruction opcode as shown in Table 1.

TABLE 1

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| B0 | 0 | 0 | 1 | z |
| B1 | 0 | 1 | 0 | z |
| B2 | 0 | 1 | 1 | z |
| A1 | 1 | 0 | 0 | z |
| A2 | 1 | 0 | 1 | z |
| A0 | 1 | 1 | 0 | z |
| Reserved | 1 | 1 | 1 | x |

Note that "z" in the z bit column refers to the zero/not zero comparison selection noted above and "x" is a don't care state. This coding can only specify a subset of the 32 registers in each register file as predicate registers. This selection was made to preserve bits in the instruction coding.

The dst field (bits 23 to 27) specifies one of the 32 registers in the corresponding register file as the destination of the instruction results.

The scr2 field (bits 18 to 22) specifies one of the 32 registers in the corresponding register file as the second source operand.

The scr1/cst field (bits 13 to 17) has several meanings depending on the instruction opcode field (bits 3 to 12). The first meaning specifies one of the 32 registers of the corresponding register file as the first operand. The second meaning is a 5-bit immediate constant. Depending on the instruction type, this is treated as an unsigned integer and zero extended to 32 bits or is treated as a signed integer and sign extended to 32 bits. Lastly, this field can specify one of the 32 registers in the opposite register file if the instruction invokes one of the register file cross paths 27 or 37.

The opcode field (bits 3 to 12) specifies the type of instruction and designates appropriate instruction options. A detailed explanation of this field is beyond the scope of this invention except for the instruction options detailed below.

The s bit (bit 1) designates the data path 20 or 30. If s=0, then data path 20 is selected. This limits the functional unit to L1 unit 22, S1 unit 23, M1 unit 24 and D1 unit 25 and the corresponding register file A 21. Similarly, s=1 selects data path 20 limiting the functional unit to L2 unit 32, S2 unit 33, M2 unit 34 and D2 unit 35 and the corresponding register file B 31.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

FIG. 5 illustrates the details of plural cache lines such as used in L1I cache 121, L1D cache 123 and L2 cache 131 illustrated in FIG. 1. Cache 500 illustrated in FIG. 5 includes cache lines 510, 520 and 520 are representative of the internal structure of cache 500. Each of cache lines 510, 520 and 530 includes: respective address tags 511, 521 and 522; respective valid bits 512, 522 and 523; respective dirty bits 513, 523 and 533; respective least recently used (LRU) indicators 514, 524 and 534; and respective data words 515, 525 and 535. Each cache line 510, 520 and 530 includes plural respective data words 515, 525 and 535. The bit length of data words 515, 525 and 535 is set by the minimal addressable data amount of CPU 110. This is typically 8 bits/1 byte.

Cache 500 stores data from more distant memories such as external memory 131 which are accessed by a multi-bit address. Cache 500 is organized to facilitate this storage and to facilitate finding such data in the cache. Each cache line 510, 520 and 530 typically stores $2^N$ respective data words 515, 525 and 535, when N is an integer. The position of data words 515, 525 and 535 within the corresponding cache line 510, 520 and 530 along the dimension 501 serves as a proxy for the least significant bits of the address.

The position of cached data within lines along dimension 502 serves as a proxy for the next most significant bits of the address. The corresponding address tags 511, 521 and 531 form the remainder of the data word address. To determine if a memory access is to data cached within cache 500 (a cache hit), cache 500 compares the address tags for all cache lines to the most significant bits of the memory location accessed. Upon a detecting a match, the position within the cache line along dimension 501 corresponds to the least significant bits of the address permitting identification of the data word accessed.

Each cache line 510, 520 and 530 includes a corresponding valid bit 512, 522 and 532. A first state of this valid bit indicates the corresponding data words 515, 525 or 535 are valid. An opposite state of this valid bit indicates the corresponding data words 515, 525 or 535 are not valid. There are several instances where data stored within cache 500 would not be valid. Upon initial activation of digital signal processor system 100 the L1I cache 121, L1D 123 cache and L2 cache 131 would not be loaded. Thus they would not store valid data. Accordingly, all cache lines are initially marked invalid. During a cache access a match of a requested address with address tags 511, 521 or 531 would not detect a match unless the corresponding valid bit 512, 522 or 532 indicated the data was valid.

Each cache line 510, 520 and 530 includes a corresponding dirty bit 513, 523 and 533. A first state of this valid bit indicates the corresponding data words 515, 525 or 535 are dirty. An opposite state of this valid bit indicates the corresponding data words 515, 525 or 535 are not dirty (clean). Cache memory is generally used for both read accesses and write accesses. Upon a cache hit for a write access, the write data is written into the corresponding location within cache 500. According to the preferred writeback technique, this write data is not immediately forwarded to external memory 131. Instead the respective dirty bit 513, 523 or 533 is set to indicate dirty. A dirty indication means that there has been a write to the cached data not currently reflected in the base memory. According to the writeback technique this data is written to the base memory with the expectation that this writeback can accumulate plural writes to the memory location and nearby memory locations within the same cache line to reduce traffic on the bus to external memory 131.

The least recently used (LRU) bits 514, 524 and 534 are used when a cache line is replaced. Because the cache cannot hold all the data stored in the large, slow memory, the data within the cache must be replaced with new data regularly. Using a data words location within dimensions 501 and 502 as proxy for the least significant bits introduces a problem in locating data within cache 500. If there is only a single cache line having the same location on dimensions 501 and 502, then plural data from the large, slow memory will alias to the same cache line in cache 500. This is data having the same least significant address bits corresponding to dimensions 501 and 502 but differing most significant address bits. An access to such aliased data would require the previous data at that cache line to be replaced. This is considered disadvantageous. A typical prior art cache is set associative. Thus a set of cache lines have the same location on dimensions 501 and 502. Typical sets include two members (two-way set associative) or four members (four-way set associative). Each cache line of such a set is called a way. A cache miss to an address that aliases to one of these sets needs only to evict one of these ways. Determination of which way to evict is typically made based on prior usage of these ways. According to both the temporal and spatial locality principles more recently used cache ways are more likely to be reused than less recently used cache ways. LRU bits 514, 524 and 534 track accesses to cache ways within the set. When data is to be replaced the LRU bits indicate the least recently used way for replacement. Maintaining cache coherence requires writeback of a dirty way upon such replacement.

Figure 6:
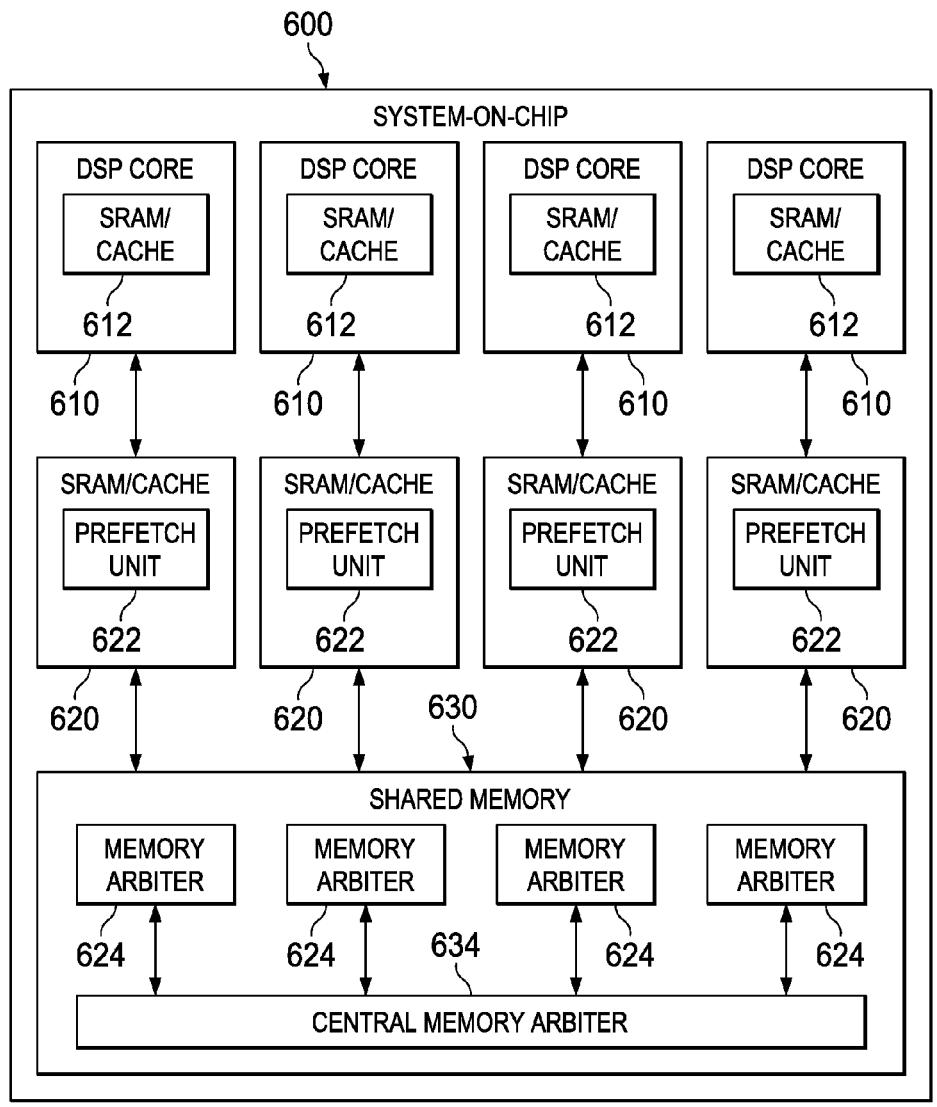
FIG. 6 illustrates a computing system including a local memory arbiter according to an embodiment of the invention.

FIG. 6 is a block diagram illustrating a computing system including a local memory arbiter according to an embodiment of the invention. FIG. 6 illustrates system on a chip (SoC) 600. SoC 600 includes one or more DSP cores 610, SRAM/Caches 620 and shared memory 630. SoC 600 is preferably formed on a common semiconductor substrate. These elements can also be implemented in separate substrates, circuit boards and packages. For example shared memory 630 could be implemented in a separate semiconductor substrate. FIG. 6 illustrates four DSP cores 610, but SoC 600 may include fewer or more DSP cores 610.

Each DSP core 610 preferably includes a level one data cache such as L1 SRAM/cache 612. In the preferred embodiment each L1 SRAM/cache 612 may be configured with selected amounts of memory directly accessible by the corresponding DSP core 610 (SRAM) and data cache. Each DSP core 610 has a corresponding level two combined cache L2 SRAM/cache 620. As with L1 SRAM/cache 612, each L2 SRAM/cache 620 is preferably configurable with selected amounts of directly accessible memory (SRAM) and data cache. Each L2 SRAM/cache 620 includes a prefetch unit 622. Each prefetch unit 622 prefetchs data for the corresponding L2 SRAM/cache 620 based upon anticipating the needs of the corresponding DSP core 610. Each DSP core 610 is further coupled to shared memory 630. Shared memory 630 is usually slower and typically less expensive memory than L2 SRAM/cache 620 or L1 SRAM/cache 610. Shared memory 630 typically stores program and data information shared between the DSP cores 610.

In various embodiments, each DSP core 610 includes a corresponding local memory arbiter 624 for reordering memory commands in accordance with a set of reordering rules. Each local memory arbiter 624 arbitrates and schedules memory requests from differing streams at a local level before sending the memory requests to central memory arbiter 634. A local memory arbiter 624 may arbitrate between more than one DSP core 610. Central memory arbiter 634 controls memory accesses for shared memory 630 that are generated by differing DSP cores 610 that do not share a common local memory arbiter 624.

Figure 7:
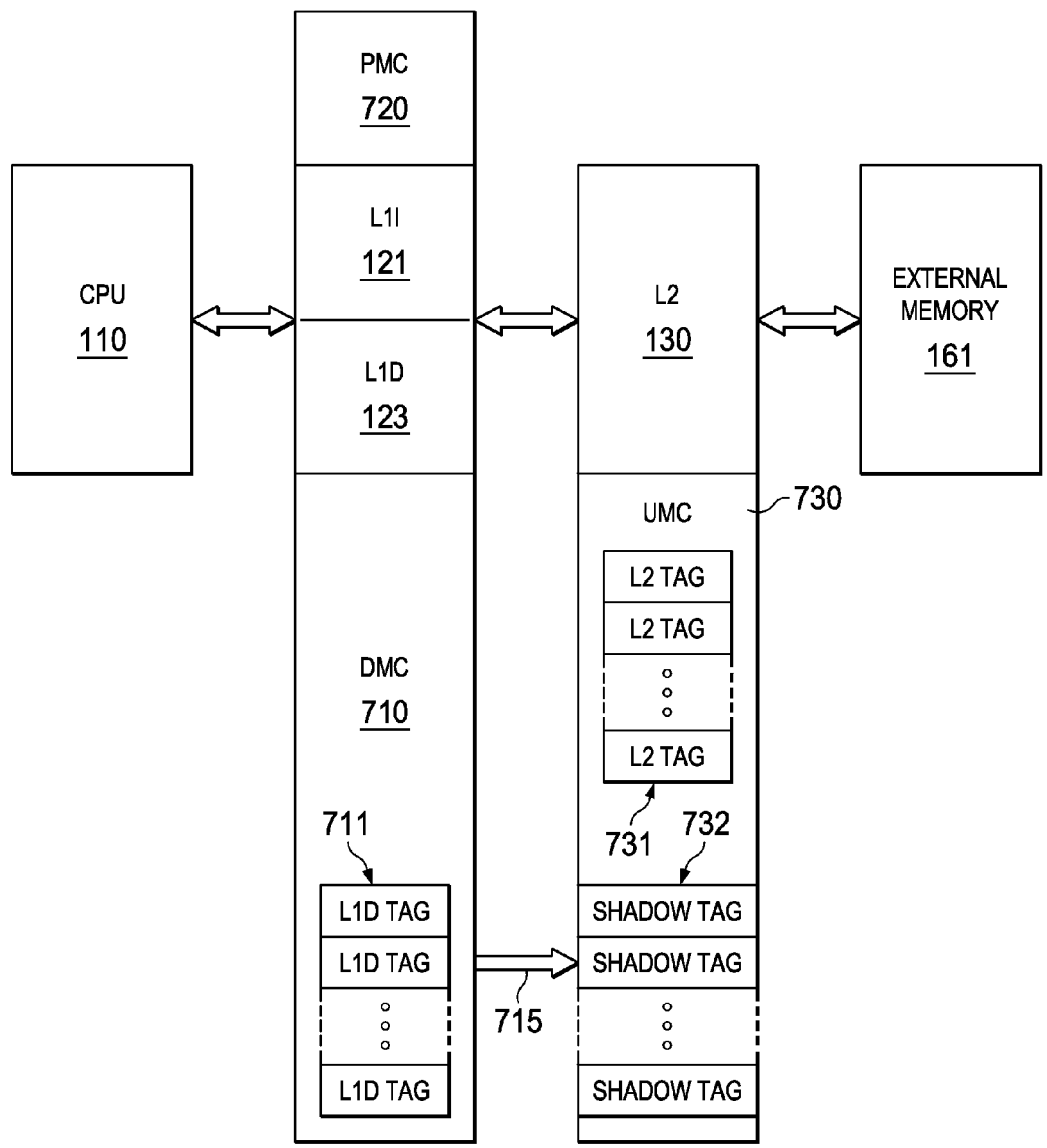
FIG. 7 is a further view of the digital signal processor system of this invention illustrating the various cache controllers.

FIG. 7 is a further view of the digital signal processor system 100 of this invention. CPU 110 is bidirectionally connected to L1I cache 121 and L1D cache 123. L1I cache 121 and L1D cache 123 are shown together because they are at the same level in the memory hierarchy. These level one caches are bidirectionally connected to L2 130. L2 cache 130 is in turn bidirectionally connected to external memory 161 and peripherals 169. External memory 161 and peripherals 169 are shown together because they are at the same level in the memory hierarchy. Data transfers into and out of L1D cache 123 is controlled by data memory controller (DMC) 710. Data transfers into and out of L1I cache 121 is controlled by program memory controller (PMC) 720. Data transfers into and out of L2 130 including both cache and directly addressable memory (SRAM) are controlled by unified memory controller (UMC) 730.

FIG. 7 illustrates further details of DMC 710 and UMC 730. DMC 710 includes L1D cache tags 711. These tags are the non-data part of cache lines 510, 520 and 530 illustrated in FIG. 5 for L1D cache 123. UMC 730 includes two sets of cache tags. The first set of cache tags are L2 tags 731. These are non-data part of cache lines 510, 520 and 530 illustrated in FIG. 5 for L2 cache 130. The second set of cache tags are shadow tags 732. As shown by bus 715 shadow tags 732 generally correspond to L1D cache tags 711 except these are located in UMC 730. Shadow tags 732 include at least the valid and dirty status of the corresponding cache lines in L1D cache 123.

DMC 710 uses shadow tags 732 to implement snoop read and write coherence. DMC 710 tracks the status of L1D cache lines. Shadow tags 732 are used only for snoops intending to keep L2 SRAM coherent with the level one data cache. Thus updates for all external cache lines are ignored. Shadow tags 732 are updated on all L1D cache allocates and all dirty and invalidate modifications to data stored in L2 SRAM. These interactions happen on different interfaces, but the traffic on that interface includes level one data cache accesses to both external and level two directly addressable lines. These interactions create extra traffic on these interfaces and creating extra stalls to the CPU. Thus in this invention shadow tags 732 are updated only on a subset of less than all updates of the level one tags.

These tag updates are pipelined out from DMC 710 to UMC 730. Command ordering requirements require DMC 710 to ensure that all tags update prior to a particular command have been send out to shadow tags 732. L1D cache 123 and CPU 110 stall until that is complete. The performance improvement from this invention is a result of having to do this very few times. Additional improvements come from reduced dynamic power consumption as a result of largely reduced accesses to the shadow tags 732.

Figure 8A:
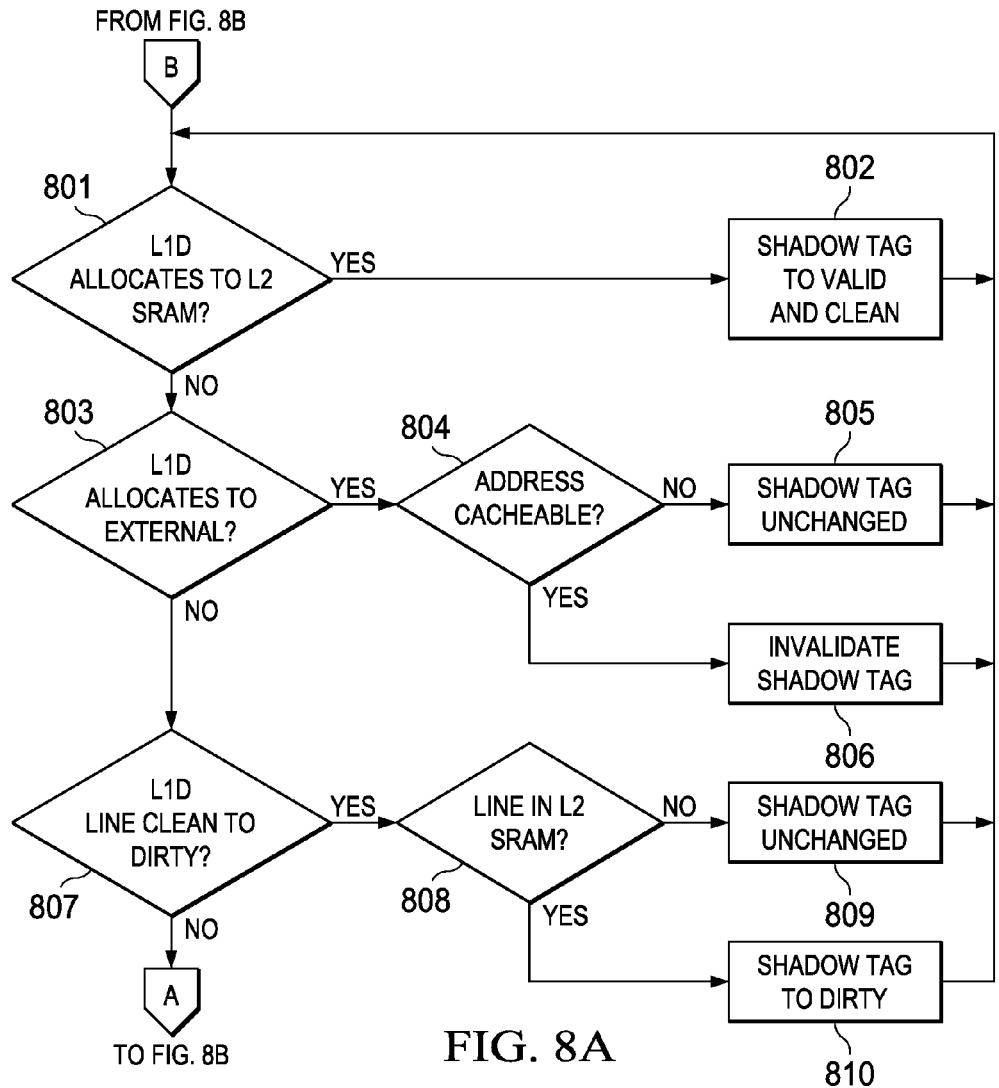
FIGS. 8A and 8B together form a flow chart illustrating when shadow tags the level two cache controller update.
Figure 8B:
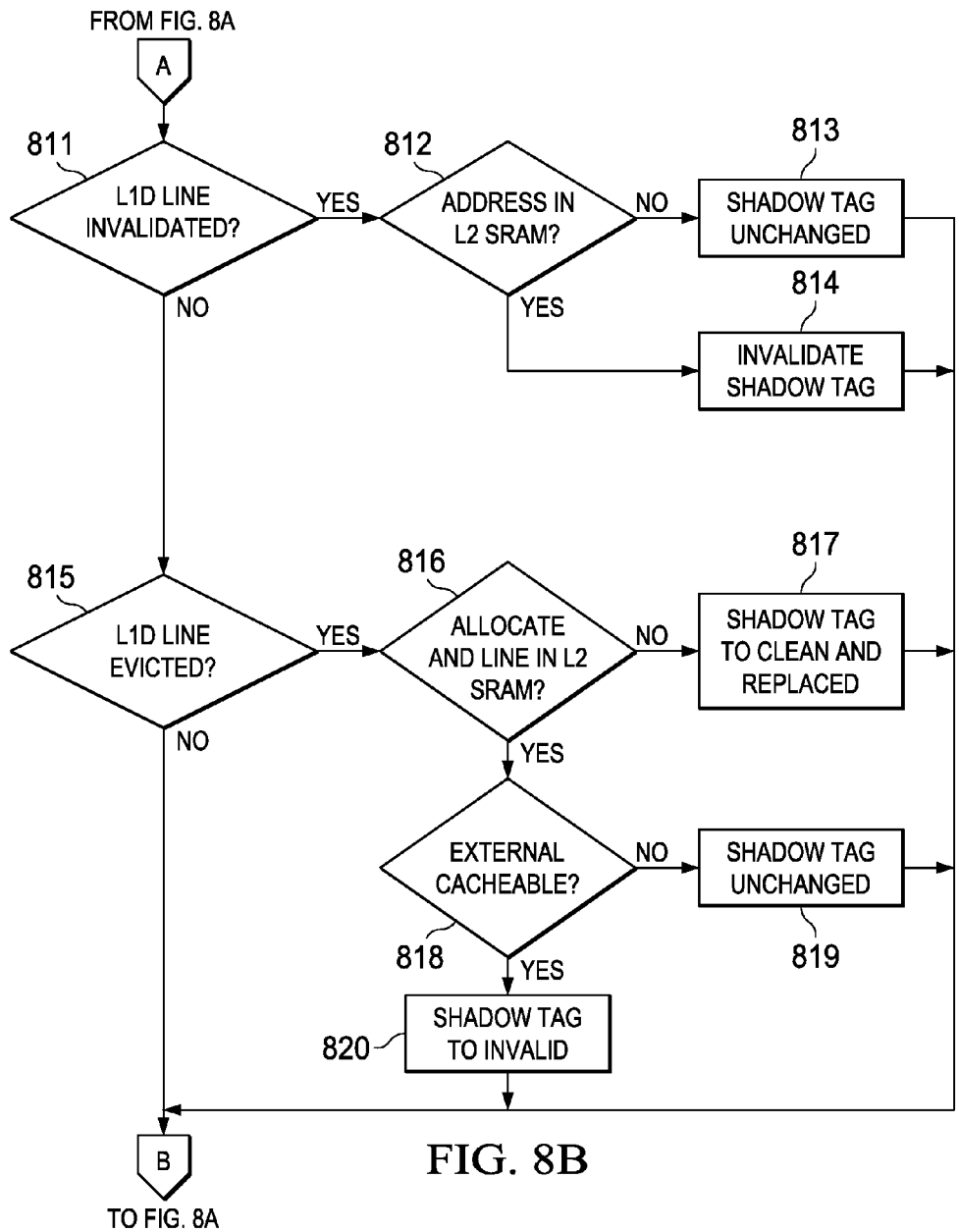

FIGS. 8A and 8B together form a flow chart illustrating when shadow tags 732 in UMC 730 updates. In accordance with this invention shadow tags 732 are not updated every time the corresponding L1D cache tags 711 update. FIG. 8 illustrates a test loop including test blocks 801, 803, 807, 811 and 815. Test block 801 determines if L1D cache 123 allocates to L2 SRAM. If this occurs (Yes at test block 801), then the shadow tag 732 for the corresponding line is marked valid and clean (block 802). Flow returns to the top of test loop.

Test block 803 determines if L1D cache 123 allocates a line to external memory. If this occurs (Yes at test block 803), then test block 804 determines if the allocated address is cacheable. If this does not occurs (No at test block 803), then the corresponding line in shadow tags 732 is unchanged (block 805). Flow returns to the top of test loop. If this occurs (Yes at test block 804), then the shadow tag 732 for the corresponding line is invalidated (block 806). Flow returns to the top of test loop.

Test block 807 determines if the status of a L1D cache line moves from clean to dirty. If this occurs (Yes at test block 807), then test block 808 determines if the line was stored in L2 SRAM. If this does not occur (No at test block 808), then the corresponding line in shadow tags 732 is unchanged (block 809). Flow returns to the top of test loop. If this occurs (Yes at test block 808), then the shadow tag 732 for the corresponding line changes to dirty (block 810). Flow returns to the top of test loop.

Test block 811 determines if a L1D cache line is invalidated. If this occurs (Yes at test block 811), then test block 812 determines if the line was stored in L2 SRAM. If this does not occur (No at test block 812), then the corresponding line in shadow tags 732 is unchanged (block 813). Flow returns to the top of test loop. If this occurs (Yes at test block 812), then the shadow tag 732 for the corresponding line changes to invalid (block 814). Flow returns to the top of test loop.

Test block 815 determines if a L1D cache line is evicted. If this occurs (Yes at test block 815), then test block 816 determines if the eviction is accompanied by an allocate and if the new line is stored in L2 SRAM. If this does not occur (No at test block 816), then the corresponding line in shadow tags 732 is changes to clean and the tag is replaced with the new value (block 817). Flow returns to the top of test loop. If this occurs (Yes at test block 816), then test block 818 determines if the external address is cacheable. If this does not occur (No at test block 818), then the corresponding line in shadow tags 732 is unchanged (block 819). If this occurs (Yes at test block 818), then the corresponding line in shadow tags 732 is changes to invalid (block 820). Flow returns to the top of test loop.

In the prior art all L1D allocates, status changes to dirty or invalid were updated in the L2 tag shadow copy. This interaction did not change based on which line was being allocated (L2 SRAM, external) and its cacheability.

A large percentage of L1D line allocates are for external addresses. This invention causes a large drop in the number of updates to the L2 tag RAM shadow copy in the L2 controller. This invention increases performance and decreases CPU stalls. This invention is advantageous by avoiding unnecessary tag shadow tag updates. This creates a large improvement in performance.

What is claimed is:

1. A data processing system comprising:
a central processing unit executing program instructions to manipulate data;
a first level data cache connected to said central processing unit temporarily storing in a plurality of cache lines data for manipulation by said central processing unit, each cache line including a tag indicating a valid and a dirty status of said data stored therein;
a first level cache operation unit connected to said first level cache capable controlling data transfers into and out of said first level cache including control of said tags;
a second level cache connected to said first level cache temporarily storing in a plurality of cache lines data for manipulation by said central processing unit, said second level cache further including memory directly addressable by said central processing unit; and
a second level cache operation unit connected to said first level cache operation unit and said second level cache controlling data transfers into and out of said second level cache, said second level cache including a set of shadow tags corresponding to said tags of said first level data cache, said second level cache operation unit updating said shadow tags on a subset of less than all changes to corresponding tags of said first data cache, said second level cache operation unit changing a shadow tag to indicate clean if said first level cache operation controller evicts a first level cache line, which is further not allocated to said memory directly addressable by said central processing unit.

2. The data processing system of claim 1, wherein:
said second level cache further includes memory directly addressable by said central processing unit; and
said second level cache operation unit sets a shadow tag to valid and clean if said first level cache operation controller allocates a tag of a corresponding first level cache line corresponding to an address within said memory directly addressable by said central processing unit.

3. The data processing system of claim 1, wherein:
said second level cache operation unit invalidates a shadow tag if said first level cache operation allocates a tag of a corresponding first level cache line to an external address if said corresponding external address is cacheable.

4. The data processing system of claim 1, wherein:
said second level cache further includes memory directly addressable by said central processing unit; and
said second level cache operation unit sets a shadow tag to dirty if said first level cache operation controller changes a tag of a corresponding first level cache line corresponding to an address within said memory directly addressable by said central processing unit from clean to dirty.

5. The data processing system of claim 1, wherein:
said second level cache further includes memory directly addressable by said central processing unit; and
said second level cache operation unit invalidates a shadow tag if said first level cache operation controller invalidates a tag of a corresponding first level cache line corresponding to an address within said memory directly addressable by said central processing unit.

6. The data processing system of claim 1, wherein:
said second level cache further includes memory directly addressable by said central processing unit; and
said second level cache operation unit updates a shadow tag if said first level cache operation controller updates a tag of a corresponding first level cache line corresponding to an address within said memory directly addressable by said central processing unit.

7. The data processing system of claim 6, wherein:
said first level cache operation controller updates a tag of a first level cache line to an address within said memory directly addressable by said central processing unit including allocating a cache line, changing a cache line from clean to dirty, invalidating a cache line and evicting a cache line.

8. A data processing system comprising:
a central processing unit executing program instructions to manipulate data;
a first level data cache connected to said central processing unit temporarily storing in a plurality of cache lines data for manipulation by said central processing unit, each cache line including a tag indicating a valid and a dirty status of said data stored therein;

a first level cache operation unit connected to said first level cache capable controlling data transfers into and out of said first level cache including control of said tags;

a second level cache connected to said first level cache temporarily storing in a plurality of cache lines data for manipulation by said central processing unit, said second level cache further includes memory directly addressable by said central processing unit; and a second level cache operation unit connected to said first level cache operation unit and said second level cache controlling data transfers into and out of said second level cache, said second level cache including a set of shadow tags corresponding to said tags of said first level data cache, said second level cache operation unit updating said shadow tags on a subset of less than all changes to corresponding tags of said first data cache, said second level cache operation unit invalidating a shadow tag if said first level cache operation controller evicts a tag of a corresponding first level cache line corresponding to an address within said memory directly addressable by said central processing unit, which is further allocated to said memory directly addressable by said central processing unit at an external cacheable address.

9. A data processing system comprising:

a central processing unit executing program instructions to manipulate data;

a first level data cache connected to said central processing unit temporarily storing in a plurality of cache lines data for manipulation by said central processing unit, each cache line including a tag indicating a valid and a dirty status of said data stored therein;

a first level cache operation unit connected to said first level cache capable controlling data transfers into and out of said first level cache including control of said tags;

a second level cache connected to said first level cache temporarily storing in a plurality of cache lines data for manipulation by said central processing unit; and a second level cache operation unit connected to said first level cache operation unit and said second level cache controlling data transfers into and out of said second level cache, said second level cache including a set of shadow tags corresponding to said tags of said first level data cache, said second level cache operation unit updating said shadow tags on a subset of less than all changes to corresponding tags of said first data cache wherein said second level cache operation unit does not update said shadow tags if the first level cache operation unit allocates to a non-cacheable address.

10. The data processing system of claim 9, wherein:

said second level cache further includes memory directly addressable by said central processing unit; and said second level cache operation unit further does not update said shadow tags if the first level cache operation unit a cache line in said first level cache changes from clean to dirty and the cache line was not stored in said memory directly addressable by said central processing unit.

11. The data processing system of claim 9, wherein:

said second level cache further includes memory directly addressable by said central processing unit; and said second level cache operation unit further does not update said shadow tags if the first level cache operation unit invalidates a cache line in said first level cache and the cache line was not stored in said memory directly addressable by said central processing unit.

12. The data processing system of claim 9, wherein:

said second level cache further includes memory directly addressable by said central processing unit; and said second level cache operation unit further does not update said shadow tags if the first level cache operation unit evicts a cache line in said first level cache, said first level cache allocates a new cache line in said memory directly addressable by said central processing unit and the external address is non-cacheable.

\* \* \* \* \*